United States Patent [19]

Rank

[11] Patent Number: 4,523,796
[45] Date of Patent: Jun. 18, 1985

[54] CONNECTOR ASSEMBLY FOR MOUNTING LEADLESS CHIP CARRIERS

[75] Inventor: William J. Rank, Minneapolis, Minn.

[73] Assignee: Control Data Corporation, Minneapolis, Minn.

[21] Appl. No.: 568,755

[22] Filed: Jan. 6, 1984

[51] Int. Cl.$^3$ .............................................. H01R 23/72
[52] U.S. Cl. ............................ 339/17 CF; 339/221 M
[58] Field of Search ................ 339/17 C, 17 F, 17 M, 339/174, 176 M, 176 MP, 221 R, 221 M

[56] References Cited

U.S. PATENT DOCUMENTS

| | | | |
|---|---|---|---|
| 3,624,586 | 11/1971 | Inacker | 339/17 CF |
| 3,910,664 | 10/1975 | Pauza et al. | 339/17 CF |
| 3,915,537 | 10/1975 | Harris et al. | 339/258 R |
| 3,923,365 | 12/1975 | Lynch | 339/221 R |
| 4,245,877 | 1/1981 | Auriana | 339/17 CF |

OTHER PUBLICATIONS

IBM Bulletin, Betz et al., vol. 9, No. 11, p. 1510, 4–1967.

*Primary Examiner*—Neil Abrams
*Attorney, Agent, or Firm*—Frederick W. Niebuhr; Joseph A. Genovese

[57] ABSTRACT

Connector assemblies are provided for mounting leadless chip carriers to a printed wiring board (PWB). Each connector assembly includes an elongate rigid and electrically insulative body, and electrically conductive leads. The body has two rows of pockets, each containing a lead. Each lead has two widened contact sectors. The shape of the lead is such that with one end mounted in the PWB, the sectors are opposite one another and approximately the same distance from the PWB. Each connector assembly is mounted by soldering the body to the PWB and mounting one end of each lead to the PWB. Each pocket has a channel narrower than the sector and wider than the general lead width, to restrain its associated lead to flexing movement in one direction transverse to the body. The sectors are offset in this transverse direction from the lead end mounted to the PWB, but in different amounts, thus to enable a staggered positioning of adjacent leads. As a chip carrier is inserted, it contacts and elastically deforms the leads, initially driving one sector of each lead against an inside wall of its associated pocket, then deforming that portion of the lead between its two sectors to move them toward each other. With the chip carrier fully inserted, the leads push against the chip carrier pads to electrically link the carrier with PWB circuitry and retain the chip carrier against the PWB.

11 Claims, 6 Drawing Figures

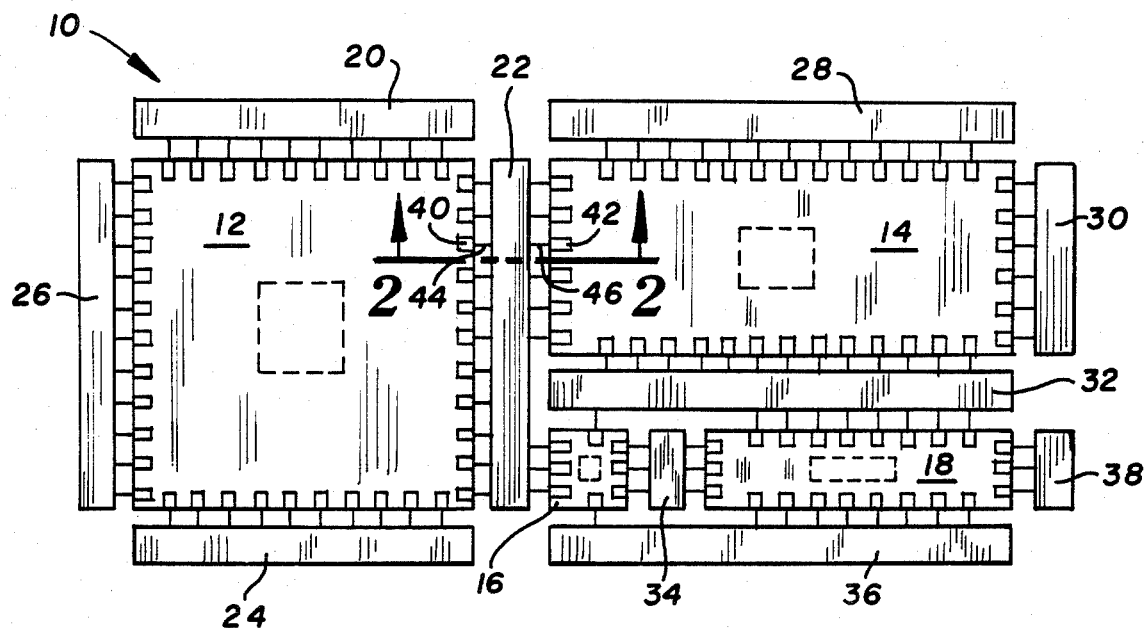
FIG. 1
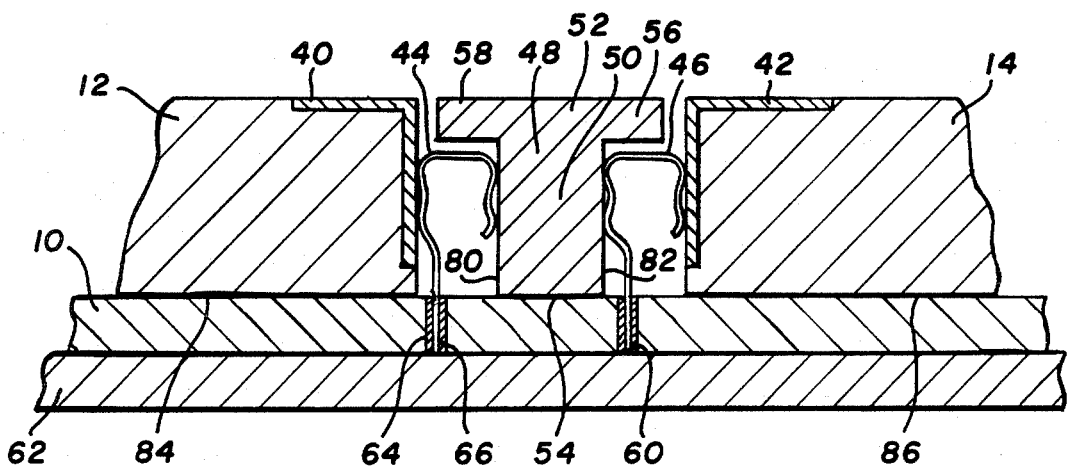
FIG. 2
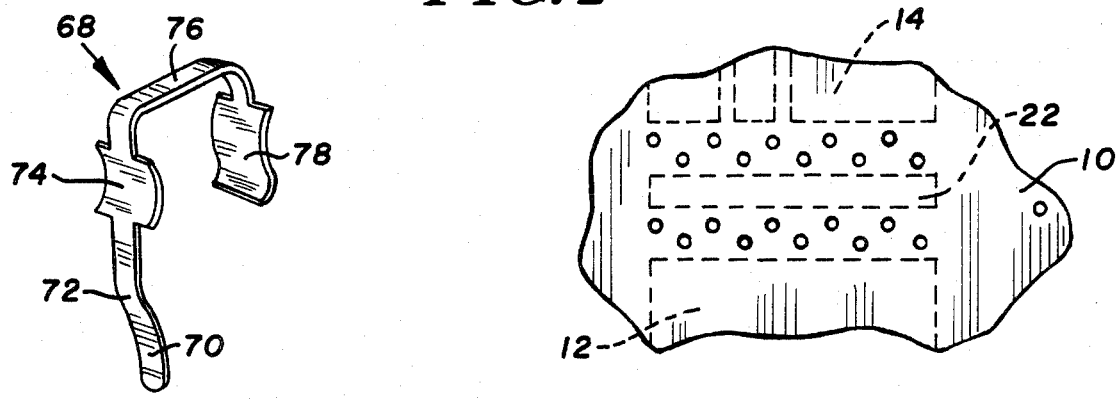
FIG. 3
FIG. 4

CONNECTOR ASSEMBLY FOR MOUNTING LEADLESS CHIP CARRIERS

BACKGROUND OF THE INVENTION

Leadless chip carriers are packages for mounting integrated circuit chips with respect to printed wiring boards. Developed to improve upon the DIP (dual in-line package), the leadless chip carrier replaces the outwardly protruding leads of the DIP with electrically conductive pads distributed about the periphery of the chip carrier. In this manner the leadless chip carrier provides an equivalent number of electrical contacts using significantly less substrate area. The chip carrier pads further form shorter and more reliable conductive paths with significantly reduced inductance and compacitance, allowing the chip carrier to handle higher frequency currents. The shorter paths also reduce signal transmission time.

A difficulty encountered, particularly when using ceramic leadless chip carriers, is in mounting the chip carrier to a conventional printed wiring board, especially in an environment of temperature extremes. This is due to the difference in thermal expansion coefficient between the ceramic chip carrier and the printed wiring board, commonly known as thermal mismatch. When the printed wiring board and chip carriers mounted thereto experience temperature extremes, the different rates at which they expand or contract causes stress concentrations at the interfacing solder joints. Repeated expansions and contractions (cycles) can cause cracking at these joints and increases electrical resistance to unacceptable levels. Thermal mismatch can hinder direct chip carrier/PWB attachment due to the difference between temperatures required for vapor phase sodering (e.g., 450° F.) and normal operating temperatures.

Attempts to solve the thermal mismatch problem include special sockets for containing the chip carrier, the sockets in turn being mounted to the printed wiring board. Aside from the added expense, these sockets take up added space on the printed wiring board and increase conductive path lengths. Another approach is to select materials more thermally compatible with the ceramic chip carrier. However, the expense has been prohibitive.

A further problem with many of the special sockets is that they require space between the leadless chip carrier and the PWB. Consequently, chip carriers must be cooled by convection, a method which often requires blowers or other air moving equipment, and is unsatisfactory in many uses, particularly in certain military applications.

It is therefore an object of this invention to provide apparatus for mounting a chip carrier directly to a printed wiring board to withstand repeated thermal cycles over a wide temperature range, with no degradation or damage to the mounting apparatus, PWB or chip carrier. It is a further object of this invention to provide a simple and convenient method for mounting leadless chip carriers directly to a PWB to enable conduction cooling. Yet another object of the invention is to provide a universal connector assembly adaptable to multiple sizes of chip carriers.

SUMMARY OF THE INVENTION

To achieve these and other objects, a connector assembly is provided for connecting a leadless chip carrier to external circuitry on a printed wiring board. The chip carrier has a plurality of electrically conductive chip carrier pads at its periphery. The connector assembly includes an elongate and electrically insulative body mounted with respect to the printed wiring board. Also mounted with respect to the printed wiring board and along a first side wall of the body are a first row of resilient, electrically conductive leads. Each lead is connected at a first end to the external circuitry and extends away from a surface of the printed wiring board. Each lead has first and second sectors generally equidistant from the printed wiring board surface and spaced apart from one another a predetermined distance transversely of the body. As the chip carrier is inserted on the printed wiring board, it contacts and elastically deforms the leads whereupon, when the chip carrier is fully inserted: one sector of each lead contacts an associated chip carrier pad; the other sector of each lead contacts the first side wall; and the transverse distance between the sectors is reduced.

In a further aspect of this invention, the connector assembly includes a second row of resilient electrically conductive leads mounted with respect to the printed wiring board and along a second side wall of the body opposed to the first side wall. As a second chip carrier is inserted on the printed wiring board, it contacts and elastically deforms the leads in the second row and, when the second chip carrier is fully inserted: one of the sectors of each lead in the second row contacts an associated pad of the second chip carrier; the other sector of each such lead contacts the second side wall; and the transverse distance between the sectors is reduced.

Preferably the connector assembly body includes transversely directed flanges at the body edge remote from the printed wiring board. The flanges cooperate with the printed wiring board and the chip carriers and side walls to substantially surround the rows of leads, thus protecting the leads from damage due to inadvertent contact or jostling.

To further protect individual leads, the connector assembly body can contain rows of pockets corresponding to the rows of leads, each lead at least partially contained in its associated pocket. Each lead is preferably uniform in width except for two somewhat wider portions corresponding to its first and second sectors. The pocket then is preferably slightly wider than the sectors but has a channel narrower than the sectors but wider than the general lead width. Two ribs in each pocket define the channel and further define two retaining walls opposed to the pocket inside wall.

For frictional containment of the leads within the pockets, each of the first and second sectors can be curved, giving it an effective thickness slightly larger than the distance between the pocket inside wall and the opposed retaining walls. Insertion of the lead into its associated pocket then elastically deforms the inserted sector, tending to elastically flatten it so that it is frictionally retained within the pocket. Finally, the first and second sectors can be offset from the lead and attached to the external circuitry, but by different amounts. This allows a staggered mounting of the lead ends to reduce the minimum separation between adjacent leads.

The leads in the connector assembly elastically push against their associated chip carrier and connector assembly body, and thus can provide the entire force necessary for retaining the chip carrier against the printed wiring board. By maintaining direct chip carrier to PWB contact, the leads permit conduction cooling of the chip carrier, eliminating the necessity for air moving equipment and expanding the range of applications for chip carriers. Should the chip carrier and printed wiring board expand at different rates in response to a temperature increase, the leads readily conform to the difference in expansion. Thus, thermal mismatch between the chip carrier and wiring board ceases to be a problem, even under severe temperature extremes.

A further advantage of the elongate body structure in the connector assembly is that the assembly body need not be equal in length to any particular side of the chip carrier that it supports. A given assembly may be longer than its associated side and thus be capable of supporting two or more chip carriers. Alternatively, two or more assemblies can be mounted along one side of a chip carrier. Consequently, the connector assemblies are suitable for mounting a variety of different sized leadless chip carriers so long as the spacing between individual conductive pads is the same for the different chip carriers involved.

IN THE DRAWINGS

The above and other features and advantages are better understood through a reading of the detailed description in connection with the drawing, in which:

FIG. 1 is a top plan view of a plurality of leadless chip carriers mounted to a printed wiring board in accordance with the present invention;

FIG. 2 is an enlarged cross-sectional view taken along the line 2—2 in FIG. 1;

FIG. 3 is a perspective view of a connector assembly lead constructed in accordance with the present invention;

FIG. 4 is a bottom plan view showing staggered mounting of adjacent leads to a printed wiring board;

DESCRIPTION OF THE PREFERRED EMBODIMENTS

Figure 5:
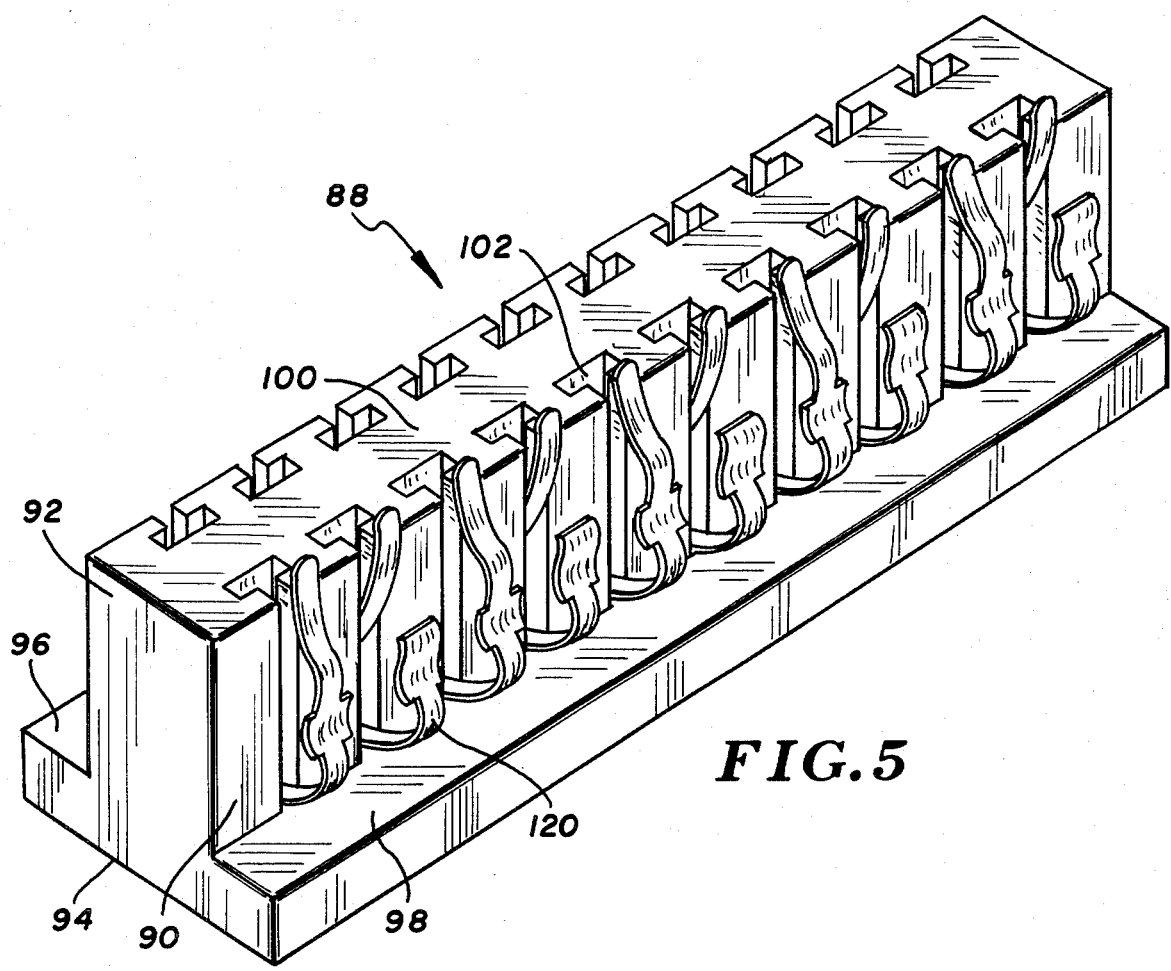
FIG. 5 is an inverted perspective view of an alternative embodiment of a connector assembly in accordance with the present invention.

Referring now to the drawings, FIG. 1 shows in top plan view a printed wiring board (PWB) 10. Mounted to the printed wiring board are first, second, third and fourth leadless chip carriers 12, 14, 16 and 18. First, second, third and fourth connector assemblies at 20, 22, 24 and 26, each running along one side of first chip carrier 12, cooperate to retain chip carrier 12 in the mounted position. In addition to supporting first chip carrier 12, second connector assembly 22 similarly cooperates with fifth, sixth and seventh connector assemblies 28, 30 and 32 to retain second chip carrier 14 against printed wiring board 10. Connector assemblies 22 and 32 further comprise part of the supporting means for third leadless chip carrier 16, eighth and ninth connector assemblies 34 and 36 providing the remaining support. Finally, connector assemblies 32, 34, 36 and a tenth connector assembly 38 all support fourth leadless chip carrier 18. Alternative arrangements are well within the scope of this invention. For example, sixth and tenth connector assemblies 30 and 38 could be replaced with a single connector assembly.

Each of the chip carriers has at its periphery an array of electrically conductive pads, two of which are identified in FIG. 1 at 40 and 42. The remaining pads are substantially identical in structure to pads 40 and 42. Mounted to printed wiring board 10 and adjacent to each of the conductive pads is a resilient and electrically conductive lead, two of which are indicated at 44 and 46 in FIG. 1. Each lead is positioned between its associated chip carrier pad and its associated connector assembly body.

The broken lines in FIG. 1 designate the locations of integrated circuit (IC) chips contained within the leadless chip carriers. Wiring internal to each chip carrier electrically links each IC chip to the pads. Such wiring is not germain to the present invention and thus is not shown.

The manner in which the connector assemblies mount the chip carriers to the printed wiring board is more clearly understood from FIG. 2 showing second connector assembly 22 between portions of leadless chip carriers 12 and 14. Connector assembly 22 includes an elongate body 48 and its associated leads. Body 48 preferably is unitary and constructed of a substantially rigid and electrically insulative material, e.g. nylon. While only leads 44 and 46 are visible in FIG. 2, it is seen from FIG. 1 that connector assembly 22 includes a total of twenty-one leads, twelve between connector assembly 22 and leadless chip carrier 12, six between the connector assembly and chip carrier 14, and the remaining three leads associated with third chip carrier 16.

Body 48 is T-shaped in cross section and includes a base portion 50 and a somewhat wider mantel 52 forming the upper portion of the body. Base 50 is mounted to printed wiring board 10 by soldering or with an epoxy resin over its bottom surface as indicated at 54. Two outwardly extended flanges 56 and 58 of the mantel cooperate with their associated chip carrier, body 48 and PWB 10 to substantially surround and thereby protect the associated leads against damage from rough handling, and further would serve to retain an individual lead in place should it work loose from its mounting within its particular opening in the printed wiring board.

Leads 44 and 46 provide the electrical connection between their associated pads 40 and 42 and external PWB wiring 60 between the bottom of printed wiring board 12 and a heat sink 62, which is optional. When heat sink 62 is used, electrically insulative film and adhesive are applied between PWB 10 and the heat sink. In this manner each lead forms a portion of the electrical linkage between its associated IC chip and the external wiring. One end of lead 44 is contained in an opening 64 in PWB 10 and extends from the top surface to the bottom surface of the PWB. Solder shown at 66 retains the lead in opening 64. The remainder of lead 44 extends above the printed wiring board top surface as a cantilever beam. Lead 46, and all the remaining leads, are mounted in a substantially identical fashion.

FIG. 3 shows in perspective view a typical lead 68 which is unitary, resilient and electrically conductive. Phospher bronze and berillium copper are suitable lead materials. Illustrated in its normal or unstressed configuration, the lead is elastically compressed when situated between its associated connector assembly body and chip carrier on a printed wiring board. Lead 68 includes a relatively straight first end 70 adapted for mounting within one of the holes in printed wiring board 10. Extended upwardly from first end 70 is a leg 72, slightly curved to horizontally (as viewed in the Fig.) offset a first or intermediate contact sector 74 from first end 70. An intermediate supporting arm 76 joins a second contact sector 78 to first sector 74. Supporting arm 76 further is looped back upon itself to horizontally align second sector 78 with first sector 74. Lead 68 is uniform in thickness and can be uniform in its width as well. However, sectors 74 and 78 preferably have an enlarged width to increase the contiguous area with an associated leadless chip carrier pad and to more securely retain lead 68 within an alternative connector assembly body described below.

First end 70 of the lead is offset from the vertical plane which is equidistant from sectors 74 and 78. As seen from FIG. 2, this offset configuration allows two alternative mountings for the leads: a first mounting in which first end 70 of the lead is nearer the leadless chip carrier than it is to the connector assembly base; and a second mounting in which first end 70 is nearer to the connector assembly. These alternative forms are shown for leads 44 and 46, respectively. When adjacent leads along one side of a connector assembly are mounted in alternate positions, a staggered hole configuration is achieved, as seen in FIG. 4. This enables a closer mounting between adjacent leads than would be the case for a linear alignment of leads and holes in the PWB.

When contained between its associated leadless chip carrier and connector assembly base, each lead is elastically deformed, i.e., the horizontal or transverse distance between its first and second sectors is reduced in FIG. 2 as compared to the same distance in FIG. 3 where the lead is free of stress. Each deformed lead exerts horizontal force to urge its associated chip carrier and connector assembly body away from one another. More particularly, lead 44 is compressed between pad 40 of leadless chip carrier 12 and a first side wall 80 of connector assembly 22. The spring force of lead 44 thus tends to urge chip carrier 12 to the left as viewed in FIG. 2. Similarly, lead 46, compressed between pad 42 and a second wall 82, urges leadless chip carrier 14 to the right. Of course the chip carriers remain stationary due to a balance of spring force from the leads on their opposing sides. For example, the counterbalancing force with respect to chip carrier 12 is provided by the row of leads between that chip carrier and a side wall of connector assembly 26.

It is the total spring force provided by all leads associated with a particular chip carrier that retains the chip carrier against the printed wiring board. The spring force in the horizontal direction combines with the friction over the contiguous area between each lead and its associated pad to prevent chip carrier movement vertically with respect to printed wiring board 10. While not necessary for chip carrier retention, it is preferable to include strips of tape such as those shown at 84 and 86 between each leadless chip carrier and the printed wiring board. Aside from assisting in retention of the chip carrier, properly selected tape can enhance conduction of heat away from the chip carrier.

An alternative embodiment of the present invention is a connector assembly 88, shown in FIG. 5 in perspective, and inverted to more clearly illustrate its structure. Connector assembly 88 includes an elongate body 90 with a base 92 and a mantel 94, thus to retain the generally T-shaped cross section, although as compared to connector assembly 22, connector assembly 88 has a wider base. The mantel has lead retaining flanges 96 and 98. The base includes a PWB facing surface 100 which normally is the bottom surface of the connector assembly.

Figure 6:
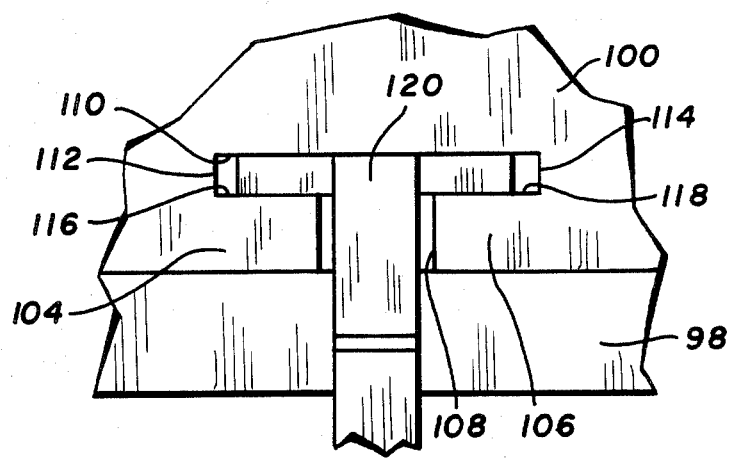
FIG. 6 is a partial bottom plan view of the connector assembly of FIG. 5.

Formed in base 92 are two parallel rows of lead retaining pockets. The pockets, one of which is identified at 102, are substantially identical and uniform in horizontal cross section. As seen in FIG. 6, exemplary pocket 102 is open to surface 100 and has two opposed ribs 104 and 106 defining an upright channel 108 through which pocket 102 is partially open to side of the connector assembly. The pocket further includes an inner wall 110, two opposed end walls 112 and 114 orthogonal to the inner wall, and two retaining walls 116 and 118, formed by ribs 104 and 106 and parallel and opposed to inner wall 110.

Pocket 102 is particularly well adapted to retain a typical lead 120 with respect to body 90. The distance between end walls 112 and 114 is slightly larger than the width of either sector of lead 120. Further, the width of channel 108 is slightly larger than the general width of lead 120, yet substantially less than the sector width. Pocket 102 contains lead 120 against any substantial longitudinal movement (to the left or right as viewed in FIG. 6), protecting the lead from damage and eliminating the possibility of inadvertent contact with neighboring leads, despite close spacing between leads.

The pocket further retains lead 120 within connector assembly 88 by frictionally restricting vertical movement relative to body 90 as viewed in FIG. 5. As seen from FIG. 3, a slight inwardly convex curvature is formed in sectors 74 and 78. In the stress-free condition for lead 68, the curvature of each sector is sufficient to give it an effective thickness, in the horizontal direction, greater than the distance between inner wall 110 and the retaining walls 116 and 118. The sectors of lead 120 are similarly curved. Insertion of lead 120 into pocket 102 involves the positioning of one of its sectors into the pocket. Such insertion tends to elastically flatten the curved sector, reducing its effective thickness and spring loading the sector. It is the spring loading, together with the sector's frictional engagement with inner wall 110 and retaining walls 116 and 118, that positively retain the lead against inadvertent movement into and out of the pocket.

A comparison of FIGS. 5 and 2 reveals yet another advantage of the pocket structure. The distance between the inner walls of opposed pockets is substantially equal to the distance between first and second side walls 80 and 82 of connector assembly 22. Yet surface 100 of connector assembly 88 is wider than its counterpart of assembly 22, resulting in increased stability and more positive attachment to the printed wiring board.

Using either of the connector assemblies described, multiple leads are mutually supported to engage a leadless chip carrier so that they provide not only the electrical path between the chip carrier and external PWB wiring, but further provide a path for heat conduction and the means for supporting the chip carrier in its mounted position against the printed wiring board. This structure permits conduction cooling, eliminating the need for convection cooling by fans or the like, and insures that no chip carrier supporting means is required other than the leads themselves. The leads readily adjust to and consequently overcome the effects of thermal mismatch. The opposed, outwardly extended flanges of the mantel protect individual leads from damage, and can retain a lead in its PWB opening should it work loose of its soldered mounting.

Lead retaining pockets can be formed in the connector assembly body to further enhance its lead protecting capabilities. Individual pockets guide their associated leads against any substantial movement in directions other than that desired, i.e. flexing inwardly and outwardly transverse to the length of the connector assembly body. The sectors of each lead, when formed into a curved shape, retain the leads within the pockets and lend support to the solder connections, maintaining the leads in the printed wiring board. This feature is particularly important when the PWB and chip carriers are subjected to extreme vibration.

Finally, the elongate, linear structure of the connector assemblies permits their use with a variety of different sized chip carriers, so long as the spacing between adjacent chip carrier pads is equal to the spacing between adjacent leads or is an integral multiple thereof.

What is claimed is:

1. A connector assembly for connecting a leadless chip carrier to external circuitry on a printed wiring board, said chip carrier having a plurality of electrically conductive chip carrier pads at its periphery, said connector assembly including:
    an elongate and electrically insulative body mounted with respect to said printed wiring board;
    a first row of resilient, electrically conductive leads mounted with respect to said printed wiring board and along a first side wall of said body, each lead connected at a first end thereof to said external circuitry and extending away from a surface of said printed wiring board; each lead having first and second sectors generally equidistant from said printed wiring board surface and spaced apart from one another a predetermined distance transversely of said body; wherein said first and second sectors are substantially identical, each of said leads adapted to be mounted in alternative positions along said body with either of said first or second sectors engaging a chip carrier pad and the remaining sector engaging said first side wall.
    wherein said chip carrier contacts and elastically deforms said leads as it is inserted on said printed wiring board, and, with said chip carrier fully inserted: one sector of each lead contacts an associated chip carrier pad; the other sector of each said lead contacts said first side wall; and said elastic deformation reduces the transverse distance between said sectors; said leads together tending to maintain the chip carrier in its fully inserted position.

2. The connector assembly of claim 1 including a second row of resiliant electrically conductive leads mounted with respect to the printed wiring board and along a second side wall of said body opposed to said first side wall;
    wherein a second chip carrier contacts and elastically deforms the leads in said second row as it is inserted on said printed wiring board, and, with said second chip carrier fully inserted: one of the sectors of each lead in said second row contacts an associated pad of said second chip carrier; the other sector of each said lead contacts said second side wall; and the transverse distance between said sectors is reduced.

3. The connector assembly of claim 1 wherein said body includes a transversely directed flange at the edge of the body remote from said printed wiring board, said flange, printed wiring board, leadless chip carrier and first side wall cooperating to substantially surround said leads; and wherein said chip carrier when fully inserted is seated directly against said printed wiring board.

4. The connector assembly of claim 1 wherein each of said leads is unitary and substantially uniform in thickness and width over the length.

5. The connector assembly of claim 1 including means defining a row of pockets in said body corresponding to said first row of leads, one sector of each of the leads in said first row contained in an associated one of said pockets.

6. The connector assembly of claim 5 wherein: each lead is generally uniform in width except for said first and second sectors; each pocket includes an inside wall wider than said sectors and further has two ribs defining two retaining walls opposed to the inside wall and defining a channel between said retaining walls, said channel being narrower than said sectors but wider than the remainder of the lead, thereby retaining said one sector in said associated pocket while allowing portions of said remainder near said one sector to move transversely into and out of said pocket along said channel.

7. The connector assembly in claim 6 wherein: each of said first and second sectors is normally curved, insertion of one of the sectors into said pocket tending to elastically flatten said one sector, thereby restricting movement of said lead with respect to said pocket.

8. The connector assembly of claim 1, wherein: said first sector is transversely offset from said first end of said lead, and said second sector is oppositely transversely offset from said first end and by a different amount than is said first sector, and adjacent leads in said first row are mounted in alternate positions in a staggered configuration in said printed wiring board.

9. Apparatus for mounting a leadless chip carrier to a printed wiring board and for connecting said chip carrier to external circuitry on said wiring board, wherein said chip carrier includes a plurality of electrically conductive pads at least along two opposed side edges thereof, said apparatus including:
    first and second elongate and electrically insulative bodies mounted with respect to said printed wiring board;
    a first row of resilient electrically conductive first leads mounted with respect to said printed wiring board and along a first side wall of said first body, each of said first leads connected to said external circuitry at a first end thereof and extended away from a surface of said printed wiring board;
    a second row of second resilient electrically conductive second leads mounted with respect to said printed wiring board and along a second side wall of said second body, each second lead connected to said circuitry at a first end thereof and extending away from said surface of said printed wiring board;
    each of said first and second leads having a first sector and a second sector, said sectors generally equidistant from said printed wiring board surface and spaced apart from one another a predetermined distance transversely of the associated one of said first and second bodies, said first and second sectors being substantially identical, each of said first and second leads adapted to be mounted in alternative positions along said bodies with either of said first or second sectors engaging a chip carrier pad and the remaining sector engaging one of said side walls;
    said chip carrier contacting and elastically deforming said first and second leads as it is inserted on said printed wiring board between said first and second bodies, and, with said chip carrier fully inserted: one of the sectors of each lead contacts an associated chip carrier pad; the other sector of each said first lead contacts said first side wall; the other sector of each said second lead contacts said second side wall; and said elastic deformation reduces the transverse distance between the sectors of each lead; said leads together tending to maintain the chip carrier in its fully inserted position.

10. The connector apparatus of claim 9 wherein: the energy stored in said first and second leads, when the same are elastically deformed, provides the sole force retaining said chip carrier against the printed wiring board.

11. The mounting apparatus of claim 9 wherein: said first sector of each lead is transversely offset from the first end of said lead, and the second sector of said lead is oppositely transversely offset from said first end and by a different amount than is said first sector, and adjacent leads in said first and second rows are mounted in alternate positions in a staggered configuration in said printed wiring board.

* * * * *